United States Patent [19]

BEST AVAILABLE COPY

Cottatellucci

[11] 3,886,472

[45] Nov. 12, 1973

[54] SYSTEM FOR STABILIZING THE OPERATING FREQUENCY OF A FREE-RUNNING OSCILLATOR

[75] Inventor: Ezio Cottatellucci, Milan, Italy

[73] Assignee: Societa Italiana Telecomunicazioni Siemens S.p.A., Milan, Italy

[22] Filed: Nov. 12, 1973

[21] Appl. No.: 414,830

[30] Foreign Application Priority Data

Nov. 10, 1972 Italy .................................. 31505/72

[52] U.S. Cl. ...................................... 331/12; 331/18

[51] Int. Cl. .............................................. H03b 3/04

[58] Field of Search ............ 331/1 A, 11, 12, 18, 34

[56] References Cited

UNITED STATES PATENTS

| | | | |
|---|---|---|---|
| 2,473,853 | 6/1949 | Boykin | 331/12 |
| 2,702,852 | 2/1955 | Briggs | 331/12 |
| 2,920,283 | 1/1960 | Cole et al. | 331/12 |
| 3,417,342 | 12/1968 | Kocher | 331/12 |
| 3,748,590 | 7/1973 | Gray | 331/12 |

*Primary Examiner*—John Kominski
*Attorney, Agent, or Firm*—Karl F. Ross; Herbert Dubno

[57] ABSTRACT

A voltage-controlled oscillator, whose operating frequency is to be clamped to that of a stable reference oscillator, feeds two mixers also receiving the output of the reference oscillator, with interposition of a 90° phase shifter or delay line between the latter oscillator and one of the mixers. The two mixers work into respective squarers with output waves in quadrature with each other, one of the resulting square waves leading or lagging the other depending upon the sign of the frequency difference between the two oscillations. A train of spikes derived from the leading edges of one square wave is fed in parallel to two AND gates, one of them receiving the other square wave and the other receiving the complement thereof so that only one gate conducts. The spikes passed by either gate are broadened in a pulse shaper and subsequently integrated to adjust the controlled oscillator.

7 Claims, 3 Drawing Figures

SYSTEM FOR STABILIZING THE OPERATING FREQUENCY OF A FREE-RUNNING OSCILLATOR

FIELD OF THE INVENTION

My present invention relates to a system for stabilizing a free-running oscillator by clamping its operating frequency to a reference frequency generated by a stable frequency source such as a crystal-controlled master oscillator.

BACKGROUND OF THE INVENTION

To stabilize the operating frequency of such a free-running oscillator, particularly one whose output is to be amplitude-modulated by a low-frequency signal, it is known to use a frequency discriminator emitting a control voltage which varies in magnitude and sign according to the difference between its input frequency and a predetermined zero frequency. This control voltage is fed back to a frequency-determining element of the controlled oscillator, e.g. to a varactor in its tank circuit, in order to compensate for any deviation of the operating frequency of that oscillator from the zero frequency of the discriminator; that zero frequency, however, is determined by a tuned circuit whose reactances are influenced by ambient conditions, especially by changes in temperature. Thus, the magnitude of the zero frequency may vary by as much as 0.1% with temperature changes between 0° and 50°C. Though this thermal instability may be reduced by almost two orders of magnitude (e.g. to about 0.002%) by the choice of a substantially lower zero frequency and a corresponding step-down of the operating frequency (by heterodying with a crystal-stabilized frequency) upon its transmission through the discriminator, the resulting frequency drift may still be objectionable.

Attempts to stabilize a voltage-controlled oscillator by comparing its operating frequency with a stable reference frequency from another source, and to generate a control voltage proportional to the frequency difference, have also not been fully satisfactory. This is due primarily to the fact that a frequency comparator of the analog type, as heretofore used for this purpose, responds only imperfectly to low beat frequencies so that an error of as much as 1 KHz may remain uncorrected.

OBJECTS OF THE INVENTION

The general object of my present invention, therefore, is to provide an improved frequency-stabilizing system avoiding the aforestated drawbacks.

More particularly, my invention aims at providing a frequency discriminator for such a system which is highly sensitive to small differences between the operating frequency of a controlled or slave oscillator and a reference frequency generated by a controlling or master oscillator.

SUMMARY OF THE INVENTION

In accordance with my present invention, a first or controlling oscillator and a second or controlled oscillator work into two mixers producing a first and a second beat frequency, with interposition of a 90° phase shifter between one of these oscillators (preferably the master oscillator) and the second mixer. By this means, the two beat frequencies are in quadrature with each other, with the second beat frequency either leading or lagging the first one depending on the relative magnitudes of the two input frequencies, i.e., on whether the operating frequency of the controlled oscillator exceeds the reference frequency or vice versa. A binary phase comparator receives these beat frequencies from the mixers to generate either of two control voltages, the output of this phase comparator being applied to the controlled oscillator to reduce the difference between the two input frequencies.

According to a more particular feature of my invention, the binary phase comparator comprises a pair of squarers in the outputs of the two mixers, one of the resulting square waves being differentiated to yield a spike at the beginning of every half-cycle thereof; the train of spikes so produced is fed in parallel to two coincidence (e.g. AND, NAND or NOR) gates which also receive the other square wave, the latter undergoing an inversion on being fed to one of these gates so that either the first or the second gate is enabled to pass a spike (either in its original or in its negated form, according to the nature of the gate). Upon subsequent integration of the spikes thus passed, a control voltage is generated in the output of one or the other gate.

For the purpose of more effective integration, the spikes may be broadened with the air of a pulse shaper before being integrated. Such a pulse shaper may comprise a one-shot or monostable multivibrator (hereinafter referred to as a monoflop) in the output of the respective squarer, the off-normal period of this monoflop being preferably equal to the maximum cycle length of the beat frequency for reasons to be explained below.

BRIEF DESCRIPTION OF THE DRAWING

The above and other features of my invention will be described in detail hereinafter with reference to the accompanying drawing in which.

SPECIFIC DESCRIPTION

Figure 1:
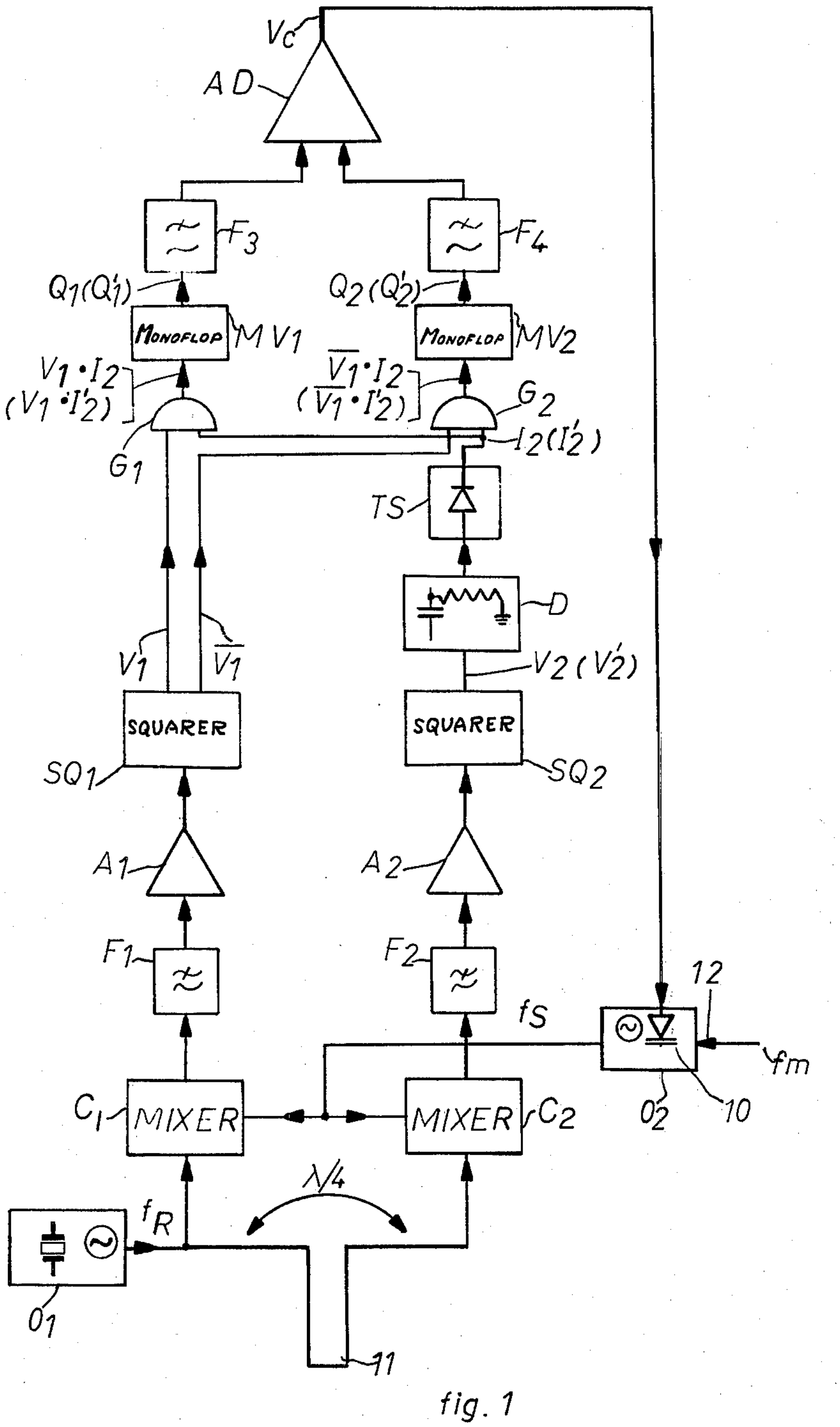
FIG. 1 is a block diagram of a frequency-stabilizing system embodying my invention.

In FIG. 1 I have shown a master oscillator $O_1$, generating a reference frequency $f_R$, and a voltage-controlled slave oscillator $O_2$ provided with a varactor 10 in its tank circuit. Oscillator $O_1$ feeds a first mixer $C_1$ directly and a second mixer $C_2$ through a 90° phase shifter 11, here shown as a quarter-wavelength delay line, whereas the two mixers are cophasally fed with the operating frequency $f_S$ of oscillator $O_2$. This oscillator is also shown provided with an input 12 for the application of low-frequency signals $f_m$ to its amplifier in order to vary the gain thereof, thereby amplitude-modulating the frequency $f_S$ as is well known per se.

Mixers $C_1$ and $C_2$, designed as balanced modulators, generate a beat frequency $f_b = |f_R - f_S|$ which is isolated from the mixer outputs by respective low-pass filters $F_1$ and $F_2$ and subsequently amplified at $A_1$ and $A_2$. As is well understood by persons skilled in the art, the two sinusoidal filter outputs of frequency $f_b$ will be in quadrature with each other, with the sine wave from filter $F_2$ either leading or lagging the sine wave from filter $F_1$ in accordance with the relative magnitudes of input frequencies $f_R$ and $f_S$. These sine waves are converted in respective squarers $SQ_1$ and $SQ_2$ into square waves $V_1$ and $V_2$ (for $f_R < f_S$) or $V'_2$ (for $f_R > f_S$), as shown in graphs (*a*), (*c*) and (*d*) of FIG. 2. In order to provide steep leading and trailing edges for these square waves, the squarers $SQ_1$ and $SQ_2$ are preferably of the regenerative-feedback (multivibrator) type.

The output of squarer $SQ_2$ is delivered to a differentiation circuit D deriving a train of alternately positive and negative spikes from the leading and trailing edges of square wave $V_2$ or $V'_2$. A half-wave rectifier TS downstream of circuit D suppresses the pulses of one polarity and transmits only the pulses of the other polarity, here positive, as shown at $I_2$ and $I'_2$ in graphs (*e*) and (*f*) of FIG. 2. Spikes $I_2$ and $I'_2$ are fed in parallel to a pair of AND gates $G_1$ and $G_2$, gate $G_1$ also receiving the square wave $V_1$ from circuit $SQ_1$ whereas gate $G_2$ receives its complement $\overline{V_1}$ from the same circuit as shown in graph (*b*) of FIG. 2.

Figure 2:
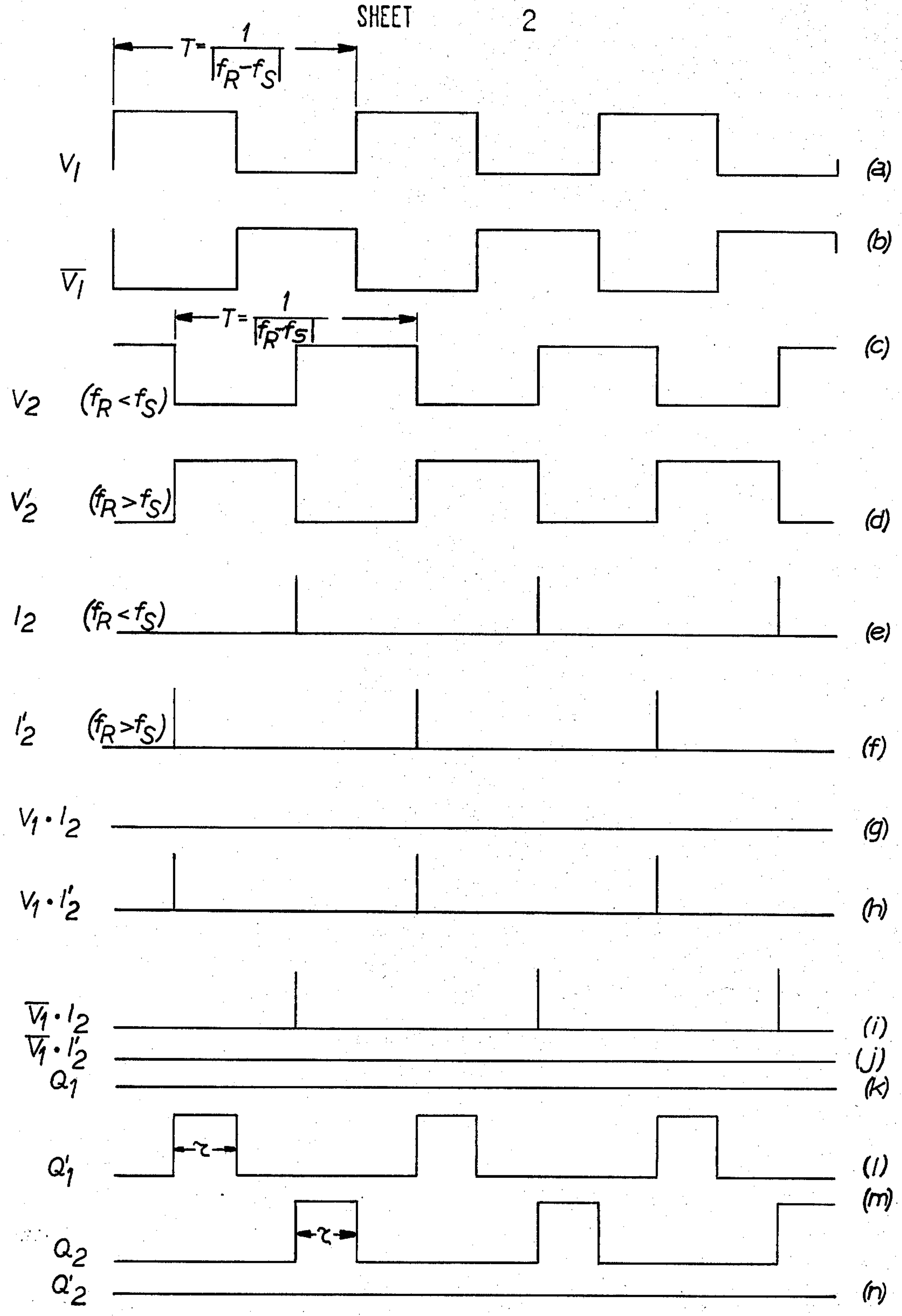
FIG. 2 is a set of graphs illustrating certain wave shapes generated in the system of FIG. 1.

Gate $G_1$ thus has a logical output $V_1{\cdot}I_2$ or $V_1{\cdot}I'_2$, illustrated in graphs (*g*) and (*h*) of FIG. 2, whereas gate $G_2$ has an output $\overline{V_1}{\cdot}I_2$ or $\overline{V_1}{\cdot}I'_2$ as illustrated in graphs (*i*) and (*j*). The logical products $V_1{\cdot}I_2$ and $\overline{V_1}{\cdot}I'_2$ are invariably zero. If the relationship of frequencies $f_R$ and $f_S$ gives rise to spikes $I_2$, then only the gate $G_1$ has an output; spikes $I'_2$, when present, will pass the gate $G_2$.

Two monoflops $MV_1$ and $MV_2$ are energizable by the outputs of gates $G_1$ and $G_2$, respectively, to generate a single pulse $Q'_1$ or $Q_2$ of duration $\tau$, as shown in graphs (*l*) and (*m*) of FIG. 2, for each spike coming from gate $G_1$ or $G_2$, respectively, provided that the spacing T of these spikes satisfies the relationship $T = 1/\ |f_R - f_S| \geq \tau$.

These wider pulses are integrated in respective low-pass filters $F_3$ and $F_4$ to produce respective control voltages applied to corresponding inputs of a differential amplifier AD. The resulting voltage Vc, of one or the other polarity, is fed back to a frequency-controlling input of oscillator $O_2$.

Amplifier AD could also be omitted, with the output voltages of integrators $F_3$ and $F_4$ applied directly to opposite terminals of the varactor of the oscillator.

Monoflops $MV_1$ and $MV_2$ have zero outputs $Q_1$ and $Q'_2$, respectively, in the nonconductive state of their associated AND gates $G_1$ and $G_2$ as indicated in graphs (*k*) and (*n*) of FIG. 2.

Figure 3:
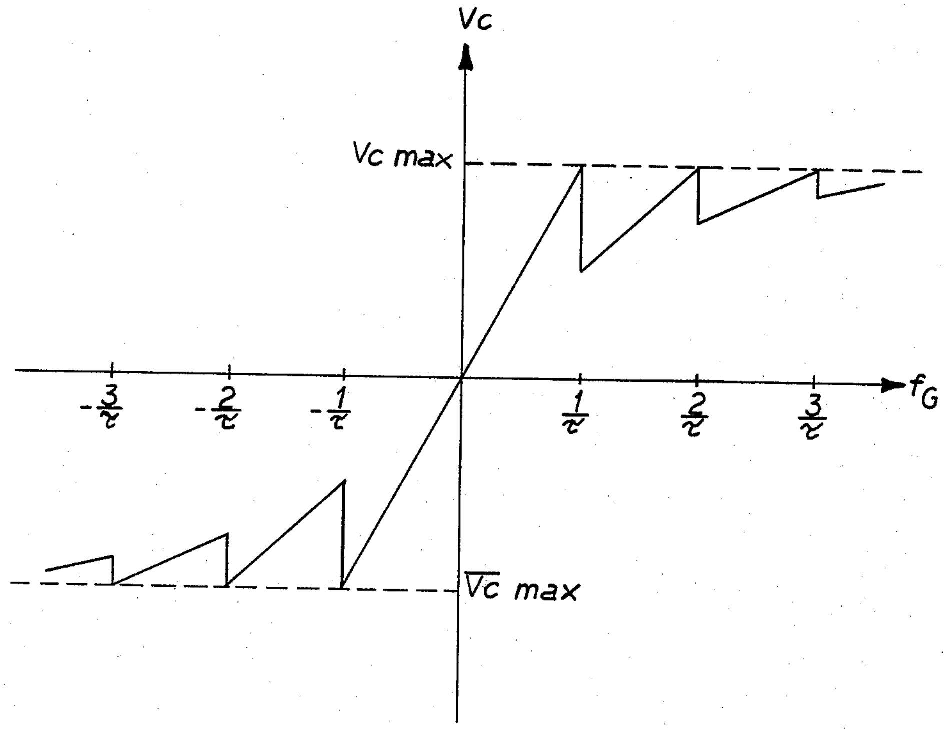
FIG. 3 is a graph showing the frequency-discriminating characteristic of the system.

In FIG. 3 I have shown the magnitude of control voltage *Vc* for various values of beat frequency $f_b$. As long as that beat frequency does not exceed $1/\tau$, the monoflops $MV_1$ and $MV_2$ will return to normal in time for triggering by the next-following spike so as to generate a pulse $Q'_1$ or $Q_2$ for each spike $I'_2$ or $I_2$. The integrated magnitude of these pulses is then a linear function of beat frequency $f_b$ as indicated between levels $Vc_{max}$ and $\overline{Vc}_{max}$. With larger beat frequencies, i.e., greater differences between input frequencies $f_R$ and $f_S$, however, two or more spikes will coincide with a single monoflop pulse of width $\tau$ so that the voltage curve of FIG. 3 exhibits discontinuities at points $\pm 1/\tau$, $\pm 2/\tau$ etc., thus resulting in a sawtooth-shaped characteristic. The range of linear operation of my improved frequency stabilizer, therefore, will be for beat frequencies $f_b$ whose cycle length is at most equal to $\tau$; however, with frequency differences beyond that range there will always be present a control voltage of the proper polarity to tend to reduce the beat frequency to zero.

Thus, my improved frequency stabilizer operates in the manner of an ideal frequency discriminator within a selected range of linearity, utilizing digital circuitry which is simpler and more dependable than its analog equivalent. It is unaffected by minor differences in transit time between branch circuits $F_1$, $A_1$, $SQ_1$ and $F_2$, $A_2$, $SQ_2$ as long as these remain below a quarter cycle of the heat frequency, i.e., $T/4$. In the clamping state $f_R = f_S$, with $f_b = 0$, these branch circuits carry direct current, no spikes are generated in differentiator D, and amplifier AD has no output.

It should be noted that the tank circuit of oscillator $O_1$, containing the varactor 10, could be tuned to a resonance frequency different from (e.g. higher than) the operating frequency $f_S$, the latter frequency being obtained by mixing the resonance frequency in the output of the oscillating amplifier with a stabilized heterodyning frequency as known per se from the conventional technique discussed in the introduction.

I claim:

1. A frequency-stabilizing system comprising:

a first oscillator generating a reference frequency;

a voltage-controlled second oscillator having an operating frequency to be clamped to said reference frequency;

first mixer means connected to said oscillators for deriving a first beat frequency from said operating and reference frequencies;

second mixer means connected to said oscillators with interposition of 90°-phase-shifting means in the output of one of said oscillators for deriving a second beat frequency in quadrature with said first beat frequency from said operating and reference frequencies;

binary phase-comparison means connected to said first and second mixer means for generating a first control voltage upon said operating frequency exceeding said reference frequency and for generating a second control voltage upon said reference frequency exceeding said operating frequency; and circuit means for applying said control voltages to said second oscillator to reduce the difference between said operating and reference frequencies;

said phase-comparison means including a pair of squarers in the outputs of said first and second mixer means for converting said beat frequencies into respective square waves, differentiation means connected to one of said squarers for deriving a spike from one of said square waves at the beginning of every other half-cycle thereof, the other of said squarers having two outputs respectively carrying the other square wave and the complement thereof, a first coincidence gate connected to said differentiation means and to one output of said other of said squarers for receiving said spikes together with the other square wave, a second coincidence gate connected to said differentiation means and to the other output of said other of said squarers for receiving said spikes together with the complement of said other square wave, integrating means for the spikes passed by either of said coincidence gates, and a pair of monostable multivibrators each inserted between one of said coincidence gates and said integrating means, said monostable multivibrators having off-normal periods equal to the minimum cycle length of said beat frequencies.

2. A system as defined in claim 1 wherein said integrating means include a pair of filter networks, further comprising a differential amplifier inserted between said filter networks and said second oscillator.

3. A system as defined in claim 1, further comprising half-wave-rectifier means inserted between said differentiation means and said coincidence gates.

4. A system as defined in claim 1 wherein said first and second mixer means comprise a pair of balanced modulators.

5. A system as defined in claim 4, further comprising a pair of low-pass filters inserted between said modulators and said squarers.

6. A system as defined in claim 1 wherein said first oscillator is crystal-controlled.

7. A system as defined in claim 1 wherein said second oscillator is provided with an amplitude-modulating input connected to a source of low-frequency signals.

* * * * *

UNITED STATES PATENT AND TRADEMARK OFFICE
CERTIFICATE OF CORRECTION

PATENT NO. : 3,886,472

DATED : May 27, 1975

INVENTOR(S) : Ezio Cottatellucci

It is certified that error appears in the above—identified patent and that said Letters Patent is hereby corrected as shown below:

Please correct the date of issue at [45] to read

-- May 27, 1975 --.

Signed and Sealed this

*Fifteenth* Day of *April 1980*

[SEAL]

*Attest:*

SIDNEY A. DIAMOND

*Attesting Officer* *Commissioner of Patents and Trademarks*